(12) United States Patent
Gall et al.

(10) Patent No.: US 6,320,803 B1
(45) Date of Patent: Nov. 20, 2001

(54) METHOD AND APPARATUS FOR IMPROVING THE TESTING, YIELD AND PERFORMANCE OF VERY LARGE SCALE INTEGRATED CIRCUITS

(75) Inventors: Martin Gall, Munich (DE); Wayne Ellis, Jericho, VT (US); Shinji Miyamoto; Masahiro Yoshihara, both of Yokohama (JP)

(73) Assignees: Infineon Technologies AC, Munich (DE); Kabushiki Kaisha Toshiba, Kanagawa-Ken (JP); International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/533,226

(22) Filed: Mar. 23, 2000

(51) Int. Cl.⁷ ..................................................... G11C 7/00
(52) U.S. Cl. ...................... 365/201; 365/200; 365/230.03
(58) Field of Search .................................. 365/201, 200, 365/230.03

(56) References Cited

U.S. PATENT DOCUMENTS

| | | | |
|---|---|---|---|
| 4,733,392 | * 3/1988 | Yamaguchi | 371/21 |
| 5,381,372 | * 1/1995 | Kozuka et al. | 365/201 |
| 5,412,662 | * 5/1995 | Honma et al. | 371/21.1 |
| 5,995,429 | * 11/1999 | Kojima et al. | 365/201 |

\* cited by examiner

*Primary Examiner*—Huan Hoang
(74) *Attorney, Agent, or Firm*—Stanton C. Braden

(57) ABSTRACT

There is provided method and apparatus for improving and making more effective the testing of very large scale integrated (VLSI) devices such as a synchronous random access memory (SDRAM), along with improving their performance and their yield in production. The method includes the steps of providing a VLSI device with switching circuitry which permits respective arrays or banks of the device to be tested alone or simultaneously with separate sequences of test mode signals to identify defects, interactions and unwanted limitations in the overall performance of the device; using the information thus obtained to modify the test mode signals and where indicated the design of the device; iterating the previous steps to optimize a test methodology for the device; and using the optimized test methodology during burn-in of production devices. Logic circuitry is added to a VLSI device to facilitate the improved testing capability.

14 Claims, 3 Drawing Sheets

METHOD AND APPARATUS FOR IMPROVING THE TESTING, YIELD AND PERFORMANCE OF VERY LARGE SCALE INTEGRATED CIRCUITS

FIELD OF THE INVENTION

This invention relates to an improved system for testing and for improving the performance of very large integrated scale integrated circuits (VLSI) such as synchronous dynamic random access memory (SDRAM) devices, and to the devices themselves.

BACKGROUND OF THE INVENTION

The density of dynamic random access memory (DRAM) devices has increased dramatically in recent years. Today 64 megabit (MB) devices, each on a single chip with an area of several tens of square millimeters, are commonplace and 256 MB devices with areas under a hundred square millimeters are becoming available. Operating speeds have increased from 50 MHz to over 500 MHz.

In earlier DRAM systems data transfer to or from a memory controller was asynchronous to the system clock to which the controller operations are referenced. But a problem arises with higher speed systems in that all timing parameters for the DRAM must be met for a particular speed sort. In other words, missing or failing to meet any timing parameter can down-sort a very fast part of the system into a slower access bin. This problem gave rise to the development of a synchronous DRAM (SDRAM) which is designed to have an input address and command interface more similar to that of the memory controller. The SDRAMs are that class of memory units which use the system clock to synchronize the interface between the memory controller and the DRAM arrays. Based on operating frequency and number of bits transferred per clock cycle, SDRAMs can provide substantial bandwidth increase over previous DRAMs.

The rapid increase in process and functional complexity in today's synchronous dynamic random access memory (SDRAM) products and VLSLs in general, creates a need for high resolution test methodologies. This requirement is driven by the need to reveal and to characterize subtle process and design interactions that may occur in the product during the technology and design development phase of the product effort. Also, once the product is qualified and in manufacturing production, precision test methodologies are required for code signal development, process learning, and also for yield and product improvement. The invention described hereinafter will illustrate the techniques utilized to implement a "Test Mode" architecture on a 256 MB SDRAM, by way of example. The invention however is applicable to VLSI products in general, as well as other products, and is not restricted solely to SDRAMs.

It is industry practice to subject products, such as SDRAMs, to a period of testing and "burn-in" before they are shipped from the factory. During burn-in the products are operated at substantially higher than normal voltages and temperatures in order to artificially stress them and thereby weed out of a given population of devices those which possibly would fail prematurely in actual operation. A burn-in period may, for example in the case of 256 MB SDRAMs, take as long as sixteen hours. Various test signals applied to the individual devices during a burn-in period are used in an attempt to find inadequate or improper operation of a given device, such as caused by microscopic defects or variations in the physical and/or electrical conditions within that device. It is desirable to be able to shorten by a substantial amount the time required for burn-in, and also to have more effective test signals and a better way of applying them to each device (e.g., an SDRAM) in order to reveal undesirable performance interactions or deficiencies within the device among its various memory arrays or sections. The present invention provides improved test methodologies for VLSIs in general, and SDRAMs in particular, as well as improved products resulting therefrom.

SUMMARY OF THE INVENTION

In accordance with one aspect of the invention there is provided a synchronous random access memory (SDRAM) device having in conventional fashion internal memory arrays or banks and having specially added logic circuits (LOGIC CKTs) provided by the invention. By means of these logic circuits, which are controlled by respective "test mode select" (TMSEL) signals, the arrays may be selectively actuated by "test mode control" (TMCNTL) signals applied to the arrays simultaneously. As a result, the respective memory banks of the SDRAM can be operated selectively and/or simultaneously in accordance with a sequence of the TMCNTL signals which are designed to reveal subtle interactions between or among the arrays or banks, such as induced noise, voltage interactions, variable signal delays, and other undesirable conditions which may not be otherwise evident in conventional testing. Knowledge of such interactions is useful in modifying the design or layout of an SDRAM during development in order to minimize or eliminate the interactions and provide a better product. Moreover, because the arrays of the SDRAM can now be tested independently and/or simultaneously, a period of burn-in can be considerably shortened relative to prior-art arrangements.

In a first apparatus aspect, the present invention is directed to apparatus for testing devices. The apparatus comprises a device having a plurality of arrays or banks, circuit means coupled to the arrays for selectively activating the arrays with respective test mode signals, test means, and input-output means. The test means applies through the circuit means a sequence of test mode signals respectively to each array separately and to all of them simultaneously to reveal whether there are defects or undesirable interactions between or amongst arrays. The input-output means sends data to and from the device.

From a second apparatus aspect, the present invention is directed to apparatus for testing devices. The apparatus comprises a device having a plurality of arrays or banks, means for applying to the device address and command signals, circuit means coupled to the arrays for selectively activating the arrays with respective test mode signals, test means, and input-output means. The test means applies through the circuit means a sequence of test mode signals respectively to each array separately and to all of them simultaneously to reveal whether there are defects or undesirable interactions between or amongst arrays. The input-output means sends data to and from the device.

From a third apparatus aspect, the present invention is directed to a very large scale integrated (VLSI) device having a plurality of memory arrays. The device has a plurality of spaced-apart arrays on a semiconductor chip, command and control means for applying command and control signals to the arrays of the device, circuit means coupled to the arrays for selectively activating the arrays with respective test mode signals, test means, and input-output means. The test means applies through the circuit means a sequence of test mode signals respectively to a selected array or arrays to reveal whether there are defects or undesirable interactions between or amongst arrays. The input-output means sends data to and from the arrays.

From a fourth apparatus aspect, the present invention is directed to a synchronous dynamic random access memory (SDRAM) device. The device comprises memory arrays placed respectively at quadrants of a semiconductor chip, means to apply command and control signals to the device, command and control signals to the device, clock means for applying clock signals to the device to synchronize its operation with external equipment, and logic circuit means. The logic circuit means is coupled to the arrays for selectively activating them in desired test mode sequences with respective test mode control (TMCNTL) signals. The device also comprises means for applying TMCNTL signals to the logic circuit means and test means that applies to the logic circuit means test mode select (TMSEL) signals such that any combination of the arrays can be activated into any desired test mode sequences by the test mode control (TMCNTL) signals and the TMSEL signals to reveal whether there are defects in the device or undesirable interactions between arrays. The device also comprises input-output means that sends data to and from the arrays.

From a first process aspect, the present invention is directed to a method of testing devices. The method comprises the steps of: providing a device with switching circuitry which permits respective arrays or banks of the device to be tested selectively with separate sequences of test mode signals to identify interactions and unwanted limitations in the overall performance of the device; using the information thus obtained to develop test mode signals and where indicated to improve the design of the device itself; and iterating the previous steps to optimize test methodology and the device itself.

From a second process aspect, the present invention is directed to a method of testing a synchronous dynamic random access memory (SDRAM) having a plurality of memory arrays located at spaced locations on a semiconductor chip. The method comprises the steps of: applying to the memory a series of test mode control (TMCNTL) signals; applying test mode select (TMSEL) signals to the memory to selectively apply the TMCNTL signals to the respective memory arrays in a programmed sequence; determining from output signals obtained from the respective memory arrays whether there are defects, undesirable interactions and unwanted limitations in the performance of the device; and iterating the previous steps to optimize a test methodology and the device itself.

From a third process aspect, the present invention is directed to a method of testing a device having a plurality of separate sections located at respective locations on a semiconductor chip. The method comprises the steps of: choosing a sequence of test modes and their corresponding test mode control (TMCNTL) signals deemed likely to best determine whether there are defects, undesirable interactions amongst the sections, and unwanted limitations in the performance of the device; applying the TMCNTL signals to the device; simultaneously applying a programmed sequence of test mode select (TMSEL) signals to the device to selectively activate respective sections thereof by the TMCNTL signals in desired sequences and combinations; determining from output signals obtained from the respective sections of the device which of the various test modes are best suited in evaluating the device; and repeating the previous steps in testing other substantially identical devices to optimize a test methodology and the devices themselves.

A better understanding of the invention together with a fuller appreciation of its many advantages will best be gained from a study of the following description and claims given in conjunction with the accompanying drawings.

DETAILED DESCRIPTION

Figure 1A:
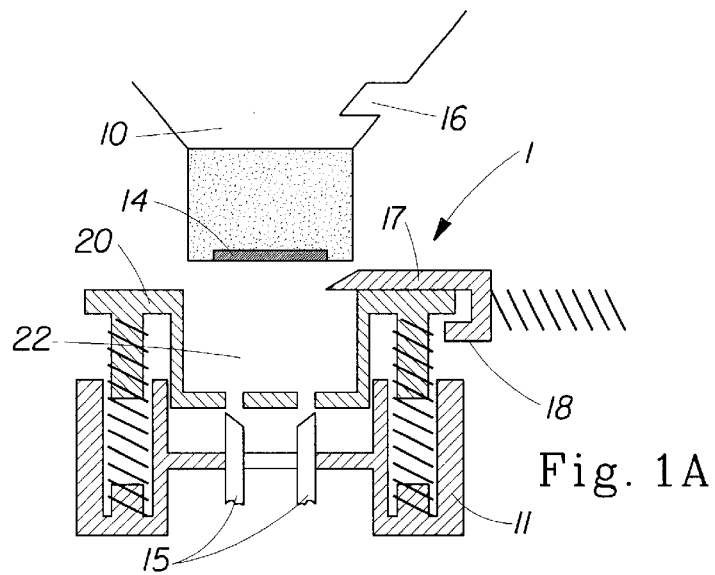
FIG. 1 is a schematic representation of a prior-art apparatus (electronic circuit) for testing VLSI devices such as a prior-art synchronous dynamic random access memory (SDRAM)
Figure 1B:
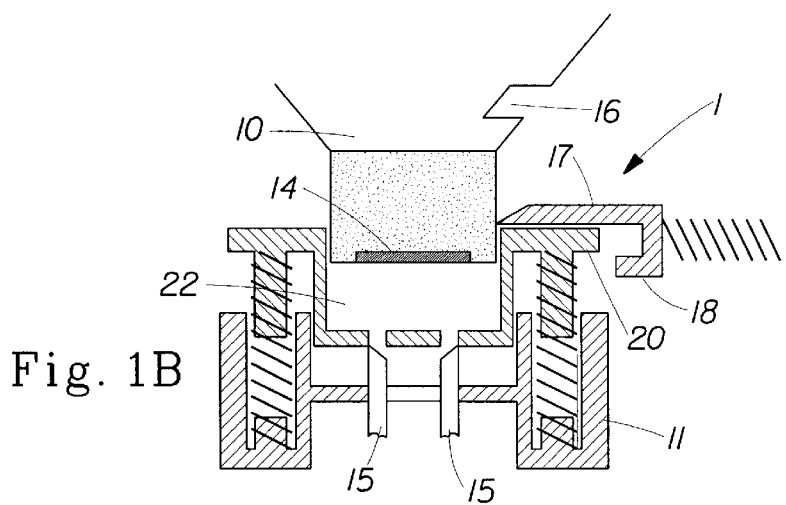
Figure 1C:
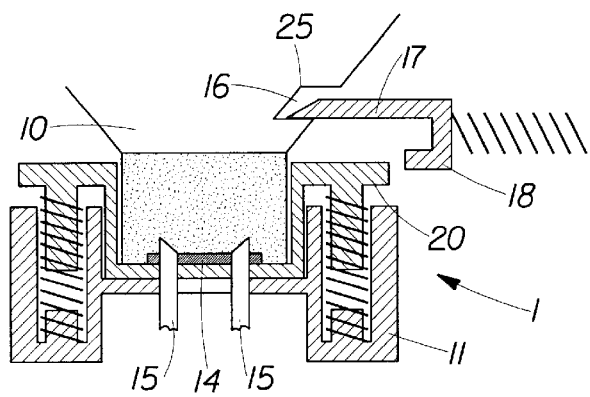
Figure 2A:
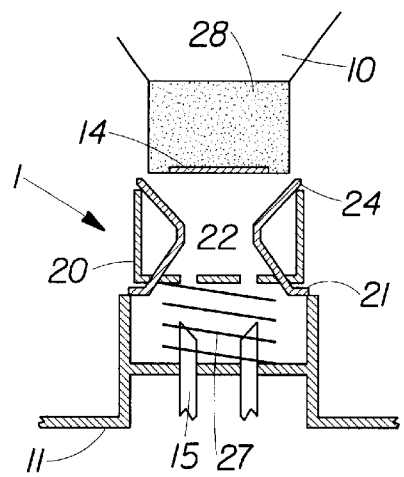
FIG. 2 is a schematic representation of an apparatus (electronic circuit) provided by the invention for testing VLSI devices, such as an improved SDRAM, also provided by the invention.
Figure 2B:
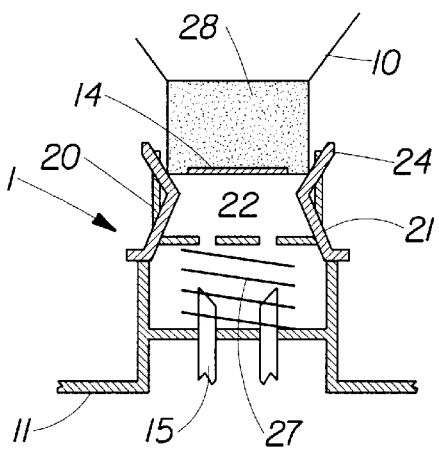
Figure 2C:
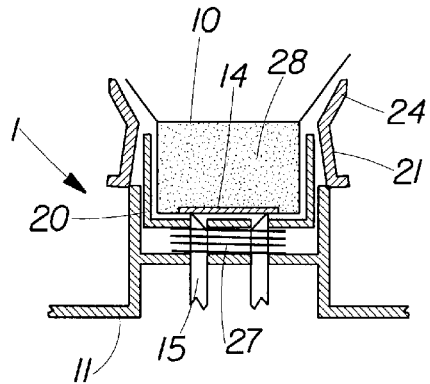
Figure 2D:
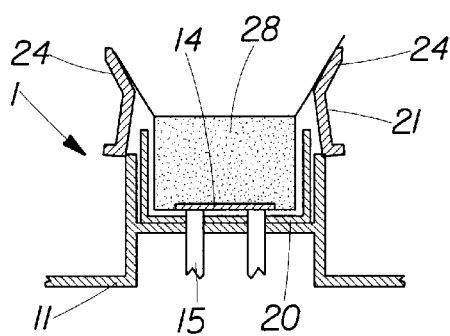

Referring to FIG. 1, there is shown an apparatus (electronic circuit) 10 illustrating a schematic of of internal circuitry connnectivity for testing prior-art devices such as a synchronous dynamic random access memory (SDRAM), and similar very large scale integrated circuits (VLSIs). The structure and operation of such apparatus are well known to those skilled in the art and will only briefly be described herein. The apparatus 10 comprises an SDRAM 12 which includes a plurality of row and column latch buffers 14 and 16, row/column address and control (CNTL) circuits shown within a dashed-line rectangle 18, and a data output circuit (DQ) 20. Clock (CLK) signals are applied to the respective terminals 22, 23 and 24; input row (RE) signals and column (CE) signals are applied to the respective terminals 26 and 28; and input BANK and address (ADDR) signals are applied to the respective terminals 30 and 32. The SDRAM 12, by way of example, has four independently addressable memory arrays 34 (i.e., banks 0, 1, 2 and 3), which have independent address and control signals applied via multi-circuit busses 36 and 38 from the respective row and column latch buffers 14 and 16. Each array 34 has associated with it a respective row decoder 40, a sense amplifier 42 and a column decoder 44. Output signals from each array 34 are applied via a multi-circuit buss 46 to the output circuit 20. The respective row and column latch buffers 14 and 16 receive signals from the control circuits 18 via respective busses 50 and 52. The row and column latch buffers 14 and 16 also have applied to them test mode control (TMCNTL) signals via the respective busses 54 and 56 which have respective input terminals 55 and 57.

The SDRAM arrays 34 can be considered as the physical four quadrants of a chip (not shown here) which is of generally rectangular shape. Being spaced over an area on the chip, there can be subtle variations of the electrical and physical properties of the arrays 34 because of their different locations on the chip. Such variations can be introduced either by sub-optimal design (e.g., electrical signal or power routing) or by process induced non-uniformities which can eventually be tuned out of the design and/or the process in the course of yield learning.

Still referring to FIG. 1, each array 34, as noted previously, has its own independent row decoders and column decoders. In these circuits, address and control signals can be latched to maintain proper activation of a particular memory array 34 (e.g., bank "0") while other banks (e.g., banks 1, 2, 3) are operated on. Taking advantage of this architecture the present invention, now to be described, provides for the selecting and latching of various test mode control (TMCNTL) signals independently in each array.

Referring now to FIG. 2, there is shown a schematic illustration of an apparatus (electrical circuit) 60 provided by the present invention for testing of VLSIs in general and more specifically an SDRAM in particular. The apparatus 60 is generally similar to the apparatus 10 of FIG. 1 but in accordance with the invention is provided with means to selectively apply to respective arrays of an SDRAM 62 (also provided by the invention) various ones of TMCNTL signals in order to operate the arrays of the SDRAM 62 independently and/or simultaneously. The apparatus 60 comprises the SDRAM 62 which has a plurality of row and column latch buffers 64 and 66, row/column address and control (CNTL) circuits shown within a dashed-line rectangle 68, and a data output circuit (DQ) 70. Clock (CLK) signals are applied to the respective terminals 72, 73, and 74 as indicated; input row (RE) signals and column (CE) signals are applied to the respective terminals 76 and 78; and input BANK and address (ADDR) signals are applied to the respective terminals 80 and 82. The SDRAM 62, by way of example, consists of four independently addressable memory arrays 84 (i.e., banks 0, 1, 2 and 3), which have independent address and control signals applied via multi-circuit busses 86 and 88 from the respective row and column latch buffers 64 and 66. Each array 84 has associated with it a respective row decoder 90, a sense amplifier 92 and a column decoder 94. Output signals from each array 84 are applied via a multi-circuit buss 96 to the output circuit 70. The respective row and column latch buffers 64 and 66 receive signals from the control circuits 68 via respective busses 100 and 102. The row and column latch buffers 64 and 66 also have applied to them test mode control signals (TMCNTL) via the respective busses 104 and 106 which have respective input terminals 105 and 107. The TMCNTL signals will be described in greater detail hereinafter.

In accordance with one aspect of the invention, the apparatus 60 of FIG. 2 is provided with an input terminal 110 to which test mode select (TMSEL) signals (0, 1, 2, and 3) are applied. A multi-circuit buss 112 is connected between this terminal 110 and the respective row and column latch buffers 64 and 66. The TMSEL signals direct selected ones of the TMCNTL signals to respective ones of the memory arrays 84 (i.e., banks 0, 1, 2, 3) for the purposes previously mentioned and as described in greater detail hereinafter. The TMSEL signals actuate logic circuits (not shown here but described in connection with FIG. 3 hereinafter), also provided by the invention. A respective one of such logic circuits is associated with each of the memory arrays 84 (banks 0, 1, 2, 3). These logic circuits on command of the respective TMSEL signals switch selected ones of the TMCNTL signals to a desired one or ones of the arrays 84. In normal operation of the SDRAM 62 the test mode control (TMSNTL) signals and the test mode select (TMSEL) signals are inactive and the address and control signals are propagated to the appropriate array 84 from the row and column latch and buffer circuits 64 and 66, to control activation of the various arrays 84, as is well known.

Figure 3:
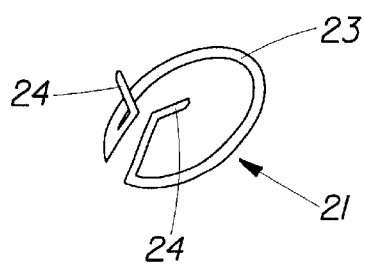
FIG. 3 is a schematic circuit illustrating internal connections and additional circuitry of a portion of the SDRAM of FIG. 2 as provided in accordance with the invention.

Referring now to FIG. 3, there is shown, not to scale, by way of further illustration of the invention, a portion of the SDRAM 62 of FIG. 2. Here in FIG. 3 for simplicity only portions of the SDRAM 62 are depicted, and the arrays 84 (banks 0, 1, 2 and 3) are shown occupying respective quadrants of a semiconductor chip 120. It is to be understood that other elements (not shown here, but see FIG. 2) of the SDRAM 62 can also be fabricated on the chip 120.

Associated with each of the memory arrays 84 (banks 0, 1, 2, 3) is a respective one of logic circuits 122 (0, 1, 2, 3) provided by the invention in conjunction with the test mode select (TMSEL) signals (0, 1, 2, 3) which are applied to the input terminal 110 (see FIG. 2). As seen in FIG. 3 these TMSEL signals are applied to each of the logic circuits 122 as indicated by the respective arrows 124, 125, 126 and 127, respectively. The logic circuits 122 (described in greater detail in connection with FIG. 4 hereinafter) each contain a plurality of gates (not shown here) which are selectively controlled by the respective TMSEL signals. The logic circuits 122 switch (connect) to the respective arrays 84 selected ones of the test mode control (TMCNTL) signals which are applied to the logic circuits 122 by the multi-conductor buss 128. Command and control signals are applied to the arrays 84 via an ADDR/CMD buss 130.

Figure 4:
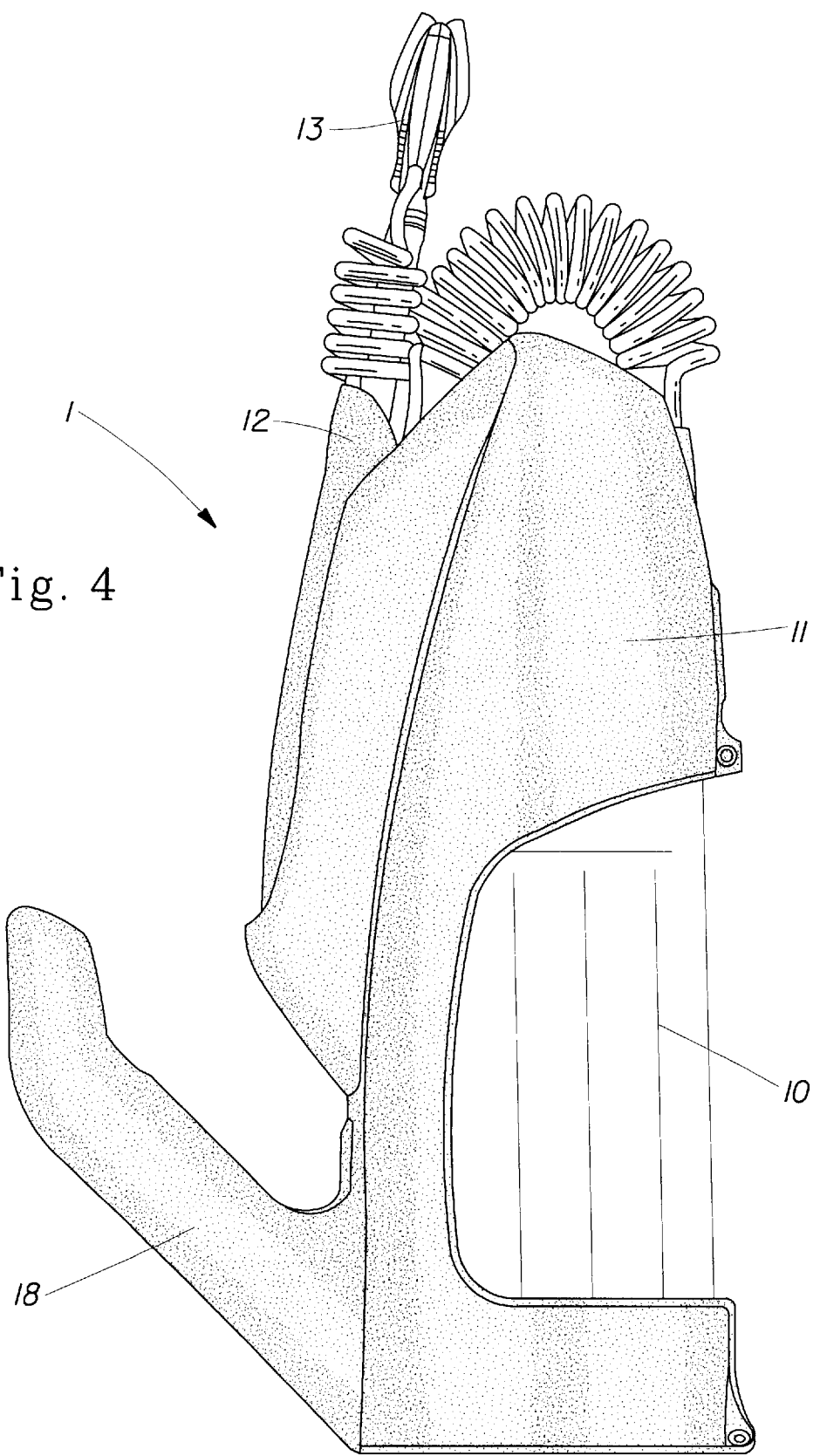
FIG. 4 is a schematic diagram showing certain elements of a portion of the circuit of FIG. 3.

Referring now to FIG. 4, there is shown a schematic diagram giving circuit details of one of the logic circuits 122(0), 122(1), 122(2), 122(3), which are all substantially identical to each other. As seen here a logic circuit 122 (0) (shown within a solid-line rectangle 132) which is associated with one of the arrays 84, namely bank (0), comprises a plurality of "NAND" gates 140 (numbered 1, 2, 3, to n) and a like plurality of inverters 142 (numbered 1, 2, 3, to n). Each "NAND" gate 140 has a first input terminal 144, all of which terminals are connected in common by a buss 146. Each of the gates 140 also has a second separate input terminal 148 and an output terminal 149 connected to an input of a separate one of the inverters 142. Each of the inverters 142 has an output terminal 150. When the respective first terminals 144 of the gates 140 are held "high" (e.g., by a binary "1"), signals then being applied to the second terminals 148 are connected in the same polarity (either a binary 1 or 0) to the respective output terminals 150 of the inverters 142 and thence to the particular array 84 bank (0), associated with the logic circuit 122 (0). When the first input terminals 144 are held "low" (e.g., by binary "0"), output terminals 150 stay at "low" (a binary "0") independent of the level of the signal applied to terminals 144.

As mentioned previously in connection with FIG. 3, test mode select (TMSEL) signals (0), indicated by a respective arrow 124, are applied to the logic circuit 122 (0). As shown here in FIG. 4, the TMSEL signals (0) are applied to the buss 146 of the logic circuit 122 (0) and thence to each and all of the terminals 144 of the gates 140. Similarly, test mode control (TMCNTL) signals, and their corresponding test modes, here in FIG. 4, numbered TM1, TM12 TM3 to TMn, are applied via the buss 128 to each of the logic circuits 122 (0, 1, 2, 3). Each test mode (TM1 through TMn) is applied to the second input terminal 148 of respective ones of the gates 140 (1 through n). Thus when the input terminals 144 of the gates 140 are held "high" by a respective TMSEL signal, the output terminals 150 of the inverters are then latched to apply the test modes as they then occur in sequence, namely TM1, TM2, TM3 to TMn, to the array 84 bank (0). In this way a programmed sequence of selected test modes (e.g., TM1 to TMn) is applied to all of the arrays 84 through their respective logic circuits 122 (0, 1, 2, 3) and respective test mode select (TMSEL) signals (0, 1, 2, 3).

The individual elements (e.g., logic circuits and their gates and inverters, row and column decoders, memory arrays, etc.) of the SDRAM 62 are well known to those skilled in the art and are not further described herein. The overall structure and operation of the SDRAM 62, with the exception of the TMSEL signals (as applied to the terminal 110 of FIG. 2) and the provision of the logic circuits 122, are also well known.

The test mode control (TMCNTL) signals are special functional modes which are used to alter the normal operation of the SDRAM 62 during wafer or module test. Test modes can be separated into three general classes.

1.) Functional Characterization Test Modes:
  They change the function or operation characteristics (e.g., output configuration, I/O signal levels, off-chip driver impedance, etc.)
2.) Process Characterization Test Modes:
  They change array operation in a manner by which process defects/marginalities and their effects on array functionality can be activated and screened. These Test Modes when activated can affect array timing, voltages, DRAM cell signal margin, etc.
3.) Test time reduction Test Modes:
  They reduce test time by increased array activation, data compression, etc. The following Table gives selected examples of various Test Modes (numbered 1 through 7), their Class, and a brief Description of each. The Test Modes are identified by their acronyms and are well known in the art along with their corresponding test mode control (TMCNTL) signals. Other Test Modes, in addition to those named, may be employed as best suited to a given device under test. Test Modes are designed to reveal defects and to show subtle interactions within the device (e.g., amongst the arrays 84 of the SDRAM 62), such as induced noise, voltage interactions, variable signal delays, etc. present in a device and not otherwise evident in conventional testing.

TABLE

| Test Mode | Class | Description |
|---|---|---|
| 1 tmx8 | functional (8-bit word instead of 16-bit) | wafer test; chip operates as x8 test for noises in I/O signaling ckts. |
| 2 tmsstl | functional | wafer/module test; lvttl=>sstl (low level or high level) signaling test I/O signaling options. |
| 3 tmwlset | process | wafer/module test; Word Line (WL) to SET change signal development time. |
| 4 tmvblb | process | wafer/module test; array operating voltage sense amp margin, cell writeback level. |
| 5 tmwlall | process | wafer test; turn on all WLs DC voltage stress of array structures. |
| 6 tmcompxl | test time reduction | wafer/module test; compress 1 output; increase chips tested in parallel. |
| 7 tm4xwl | test time reduction | wafer/module test; activate 4xWLs activate 4x array. |

By combining the array or bank select addresses with Test Mode activation commands, the TMSEL signals to be applied at the terminal 110 (FIG. 2) and thence to the logic circuits 122 (FIG. 4) can be created. By application of the TMSEL signals at the terminal 110, any combination of the four arrays 84 of the SDRAM 62 can be programmed into any desired Test Modes (such as illustrated in the above Table) to alter, or not alter, its normal operation.

Such versatile operating capability can then be used to selectively activate for example, any of the "Process Characterization" class of "Test Modes" independently in each array 84 of the SDRAM 62. This then enables the utilization of the chip 120 as a highly flexible and efficient vehicle for the characterization of subtle process defects, such as across-chip-line-width-variation (ACLV) as well as subtle defect distributions based on location. An example of this is the characterization of array operating margins while the chip is activated in a bank "Ping-Pong" mode. In this mode of operation, array banks are sequentially activated, data is fetched or stored, and each bank is closed and restored for subsequent activation. This operation creates the most internal chip-voltage noises. Another application of this invention is to selectively set the "tmwlset" (Test Mode No. 3 in the above Table) in one or more arrays 84 at a different value from the others. This allows the characterization of the local power buss noises in a given array 84 while the other arrays maintain their normal operation margins. By contrast, the prior art (e.g., the apparatus 10 of FIG. 1) shifts simultaneously the operation of all memory arrays, and this masks some of the more subtle yet prevalent process marginalities from discovery and correction.

The present invention also allows development of more flexible test and burn-in methodologies. For example, the invention allows for a selection from amongst hundreds of possible test modes signals those best suited for testing of a particular device, such as the SDRAM 62. In prior burn-in methodologies only one of the memory arrays (e.g., the bank "0") is activated at a given time, the rest of the arrays are in standby. But by virtue of this invention the Test Mode "tmwlall" (No. 5 in the above Table) can be applied to inactive arrays of the SDRAM 62, charging all of the respective word lines (WLs) high. This then applies a DC stress in the inactive arrays while the other array is being AC stressed. When the AC stress is complete in the active array, this array can then be activated into the DC voltage stress burn-in mode, and one of the previously DC-stressed arrays is then de-activated and re-activated into AC mode. In this way, the four arrays 84 of the SDRAM 62 receive a DC and an AC stress in less elapsed time than the prior state of the art allows.

The test modes listed in the above Table are given by way of example. Other such test modes (and their corresponding TMCNTL signals) may occur to those skilled in the art and may be used without departing from the spirit or scope of the invention. The invention is not limited to any particular size of SDRAM (e.g., 256 MB) and is not limited solely to use with SDRAMs but may be used with other VLSI devices. The invention is useful both during product development and during burn-in of production parts.

Various minor changes in the apparatus, method, and device described herein may occur to those skilled in the art, and can be made without departing from the spirit or scope of the invention as set forth in the accompanying claims.

What is claimed is:

1. Apparatus for testing devices comprising:

a device having a plurality of arrays or banks;

circuit means coupled to the arrays for selectively activating the arrays with respective test mode select signals and test mode control signals;

test means for applying through the circuit means a sequence of test mode select signals and test mode control signals respectively to each array separately and to all of them simultaneously to reveal whether there are defects or undesirable interactions between or amongst arrays; and input-output means for sending data to and from the device.

2. The apparatus of claim 1 wherein:

the device is a synchronous dynamic random access memory (SDRAM) having four memory arrays which occupy the respective quadrants of a semiconductor chip; and the circuit means comprises:

logic circuits coupled respectively to the arrays and serving as controllable switches; and signal means coupled to the logic circuits for applying test mode select signals and test mode control signals to the logic circuits.

3. Apparatus for testing devices comprising:

a device having a plurality of arrays or banks;

means for applying to the device address and command signals;

circuit means coupled to the arrays for selectively activating the arrays with respective test mode select signals and test mode control signals;

test means for applying through the circuit means a sequence of test mode select signals and test mode control signals respectively to each array separately and to all of them simultaneously to reveal whether there are defects or undesirable interactions between or amongst arrays; and input-output means for sending data to and from the device.

4. The apparatus of claim 3 wherein the device is a synchronous dynamic random access memory (SDRAM) with memory arrays occupying quadrants of a generally rectangular semiconductor chip; and the circuit means contains at least one logic circuit having a plurality of gate switches, the gate switches being selectively activated by test mode select signals to control the application of test mode control signals to the respective arrays.

5. A very large scale integrated (VLSI) device having a plurality of memory arrays and comprising:

a plurality of spaced-apart arrays on a semiconductor chip;

command and control means for applying command and control signals to the arrays of the device;

circuit means coupled to the arrays for selectively activating the arrays with respective test mode signals including test mode select and test mode control signals;

test means for applying through the circuit means a sequence of the test mode signals respectively to a selected array or arrays to reveal whether there are defects or undesirable interactions between or amongst arrays; and input-output means for sending data to and from the arrays.

6. The device of claim 5 in which the arrays are dynamic random access memory arrays of a synchronous dynamic random access memory, the arrays occupying respective quadrants of the chip; and in further combination with means to apply clock signals to the device such that the operation of the device can be synchronized with external equipment.

7. A synchronous dynamic random access memory (SDRAM) device comprising:

memory arrays placed respectively at quadrants of a semiconductor chip;

means to apply command and control signals to the device;

clock means for applying clock signals to the device to synchronize its operation with external equipment;

logic circuit means coupled to the arrays for selectively activating them in desired test mode sequences with respective test mode control (TMCNTL) signals;

means for applying TMCNTL signals to the logic circuit means;

test means for applying to the logic circuit means test mode select (TMSEL) signals such that any combination of the arrays can be activated into any desired test mode sequences by the test mode control (TMCNTL) signals and the TMSEL signals to reveal whether there are defects in the device or undesirable interactions between arrays; and input-output means for sending data to and from the arrays.

8. A method of testing devices comprising the steps of:

providing a device with switching circuitry;

selecting respective arrays or banks of the device and testing them selectively with separate sequences of test mode control signals to identify interactions and unwanted limitations in the overall performance of the device;

using the information thus obtained to develop test mode control signals and where indicated to improve the design of the device itself; and iterating the previous steps to optimize test methodology and the device itself.

9. The method of claim 8 in further combination with the step of using the thus obtained optimized test methodology during burn-in of production devices.

10. A device having the benefits of an evaluation and performance testing in accordance with the method of claim 8.

11. A device having the benefits of an optimized test methodology during burn-in in accordance with the method of claim 9.

12. A method of testing a synchronous dynamic random access memory (SDRAM) having a plurality of memory arrays located at spaced locations on a semiconductor chip, the method comprising the steps of:

applying to the memory a series of test mode control (TMCNTL) signals;

applying test mode select (TMSEL) signals to the memory to selectively apply the TMCNTL signals to the respective memory arrays in a programmed sequence;

determining from output signals obtained from the respective memory arrays whether there are defects, undesirable interactions and unwanted limitations in the performance of the device; and iterating the previous steps to optimize a test methodology and the device itself.

13. The method of claim 12 in further combination with the step of using the optimized test methodology during burn-in of production memories.

14. A method of testing a device having a plurality of separate sections located at respective locations on a semiconductor chip, the method comprising the steps of:

choosing a sequence of test modes and their corresponding test mode control (TMCNTL) signals deemed likely to best determine whether there are defects, undesirable interactions amongst the sections, and unwanted limitations in the performance of the device;

applying the TMCNTL signals to the device;

simultaneously applying a programmed sequence of test mode select (TMSEL) signals to the device to selectively activate respective sections thereof by the TMCNTL signals in desired sequences and combinations;

determining from output signals obtained from the respective sections of the device which of the various test modes are best suited in evaluating the device; and repeating the previous steps in testing other substantially identical devices to optimize a test methodology and the devices themselves.

* * * * *